US010825646B2

(12) United States Patent
LeGrove

(10) Patent No.: US 10,825,646 B2
(45) Date of Patent: Nov. 3, 2020

(54) ACTUATOR-ASSISTED POSITIONING SYSTEMS AND METHODS

(71) Applicant: FEI Company, Hillsboro, OR (US)

(72) Inventor: Graham LeGrove, Portland, OR (US)

(73) Assignee: FEI Company, Hillsboro, OR (US)

(*) Notice: Subject to any disclaimer, the term of this patent is extended or adjusted under 35 U.S.C. 154(b) by 0 days.

(21) Appl. No.: 16/368,566

(22) Filed: Mar. 28, 2019

(65) Prior Publication Data
US 2020/0312605 A1 Oct. 1, 2020

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01); *H01J 2237/20264* (2013.01); *H01J 2237/20285* (2013.01)

(58) Field of Classification Search
CPC .. H01J 37/20; H01J 37/28; H01J 2237/20264; H01J 2237/20285; H01J 2237/20207; H01J 2237/0228
See application file for complete search history.

(56) References Cited

U.S. PATENT DOCUMENTS

| | | | | |
|---|---|---|---|---|
| 6,740,894 B1* | 5/2004 | Mitchell | ............... | H01J 37/20 250/398 |
| 6,963,068 B2 | 11/2005 | Asselbergs et al. | | |
| 7,474,419 B2 | 1/2009 | Tappel et al. | | |
| 8,334,520 B2* | 12/2012 | Otaka | ............... | H01J 37/20 250/310 |
| 8,754,384 B1 | 6/2014 | Persoon et al. | | |
| 2008/0211349 A1* | 9/2008 | Seya | ............... | H02N 2/0025 310/323.02 |
| 2009/0218510 A1* | 9/2009 | Fujita | ............... | H01J 37/20 250/443.1 |
| 2009/0251091 A1* | 10/2009 | Fujita | ............... | H01J 37/20 318/594 |
| 2011/0240410 A1* | 10/2011 | Barrio | ............... | B66D 5/30 187/288 |
| 2012/0074320 A1 | 3/2012 | Biberger et al. | | |

(Continued)

FOREIGN PATENT DOCUMENTS

JP 2015191751 A * 11/2015

*Primary Examiner* — David E Smith
(74) *Attorney, Agent, or Firm* — Klarquist Sparkman, LLP

(57) ABSTRACT

A positioning system can include a guide, a carrier element configured to engage and convey a workpiece, a motor having a mover element, a restraint coupled to the carrier element, and an actuator disposed between the restraint and the carrier element. The guide can be movable relative to a horizontal reference plane such that the carrier element coupled to the guide is inclined with respect to the horizontal reference plane. At least the mover element of the motor can be coupled to the carrier element and can be configured to move the carrier element along the guide. The restraint can be configured to selectively engage the guide to restrain movement of the carrier element in at least one direction along the guide when the guide is inclined out of the horizontal reference plane. The actuator can be configured to displace the carrier element relative to the restraint along the guide when the restraint is engaged with the guide.

20 Claims, 13 Drawing Sheets

(56) References Cited

U.S. PATENT DOCUMENTS

| | | | |
|---|---|---|---|
| 2014/0312246 A1* | 10/2014 | Takahashi | H01J 37/20 250/453.11 |
| 2016/0005568 A1* | 1/2016 | Mizuochi | H01J 37/20 250/442.11 |
| 2016/0035534 A1* | 2/2016 | Biberger | H01J 37/20 250/307 |
| 2016/0284506 A1* | 9/2016 | Ogawa | H01J 37/20 |
| 2017/0076966 A1 | 3/2017 | Vix | |

* cited by examiner

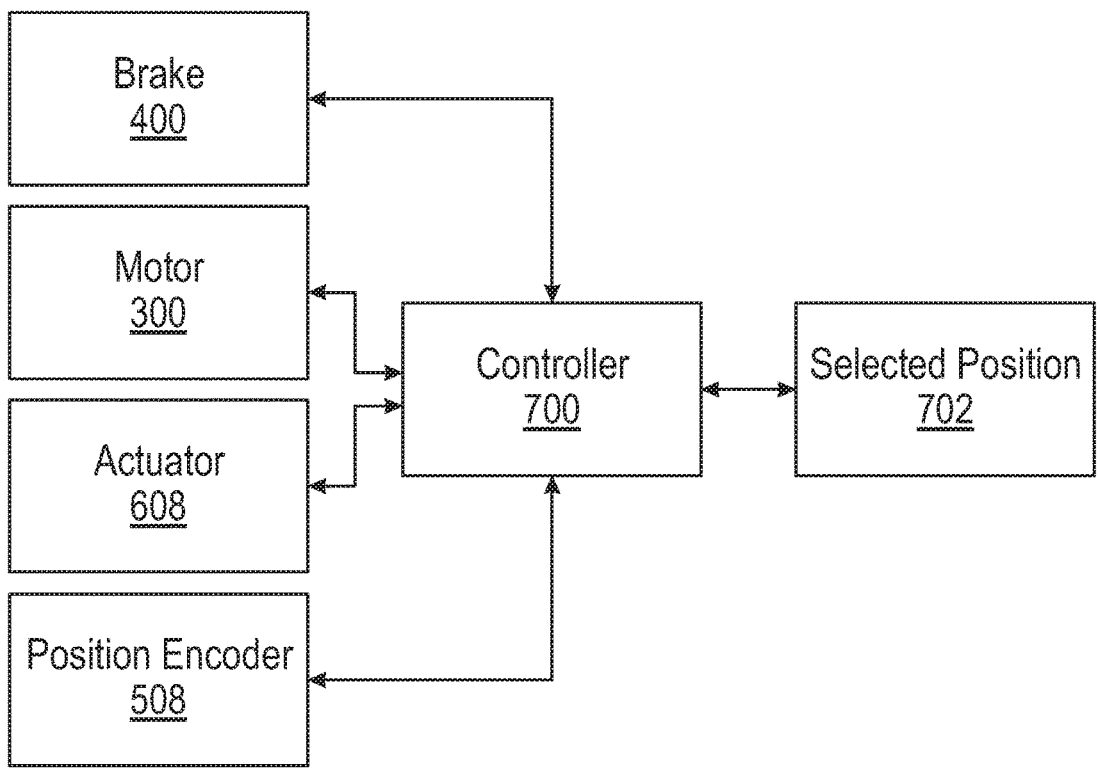

802
Move a carrier element along a guide with a motor, at least a mover element of the motor being coupled to the carrier element, the carrier element being inclined relative to a horizontal reference plane, the guide being movable relative to the horizontal reference plane, the carrier element being configured to engage and convey a workpiece 804
Engage the guide with a restraint coupled to the carrier element to restrain movement of the carrier element in at least one direction along the guide 806
Actuate the actuator disposed between the restraint and the carrier element to move the carrier element relative to the restraint along the guide

FIG. 10

ACTUATOR-ASSISTED POSITIONING SYSTEMS AND METHODS

FIELD

This disclosure pertains to systems and methods for moving and restraining a positioning system for a workpiece.

BACKGROUND

Microscopic imaging and processing (e.g., by milling) of a workpiece, such as using a multi-beam system comprising one, two, or more instruments (e.g., scanning electron microscopes (SEM), ion columns, lasers, and/or other beam-generating instruments) can require precisely positioning the workpiece along multiple degrees of freedom in order to capture an image or process a desired area. Moreover, in process chambers including such instruments, various of the instruments, tools, and/or sensing elements typically must be arranged at an angle in order to fit within the space constraints of the chamber.

Generally, positioning systems include a carrier element to which the workpiece can be mounted and a set of actuators, such as motors, arranged to move the carrier element along directions parallel to an X-axis, a Y-axis, and a Z-axis, where the X-, Y-, and Z-axes are mutually orthogonal. Typical positioning systems can move in four degrees of freedom, with three perpendicular translations, and rotation about the Z-axis. However, some positioning systems can move in five degrees of freedom, with three perpendicular translations and rotations about two axes. For example, the carrier element of some positioning systems can rotate out of the X-Y plane and assume a tilted configuration. This tilted configuration allows for control over the angle of the workpiece relative to instruments such as an electron beam generated by an SEM, a focused ion beam (FIB) generated by an ion column, and/or a laser beam generated by a laser.

Some existing positioning systems are actuated using piezoelectric motors. However, piezoelectric motors may wear out quickly in high-throughput applications such as semiconductor fabrication. Other positioning systems have attempted to solve this problem using linear motors. Linear motors are quick and accurate; however, they must be energized in order to function, and the magnetic field generated while the motor is energized can adversely affect the quality of imaging and/or processing by deflecting the beams. For this reason, positioning systems typically move the workpiece while the beam system is not operational, and the motors are de-energized once the carrier element is in place.

However, as mentioned above, some positioning systems can assume a tilted configuration. In such configurations, the tilted position of the carrier element results in asymmetric loading of the positioning system. Brake mechanisms can be used to prevent the asymmetrically-loaded carrier element from moving once the linear motors are de-energized. However, the transition from the energized motion or drive state to the de-energized state at a selected position for workpiece processing on an inclined or otherwise asymmetrically loaded axis can result in loss of position (e.g., due to relaxation or motion of one or more components of the system along the direction of the axis).

Accordingly, there is a continuing need for improved systems for positioning workpieces with high accuracy within space-constrained process chambers.

SUMMARY

Described herein are embodiments of braking mechanisms for positioning systems, as well as methods for using such systems.

In a representative embodiment, a positioning system can comprise a guide, a carrier element coupled to the guide, a motor comprising a mover element, a restraint coupled to the carrier element, and an actuator disposed between the restraint and the carrier element. The guide can be movable relative to a horizontal reference plane such that the carrier element is inclined with respect to the horizontal reference plane. The carrier element can be configured to engage and convey a workpiece. At least the mover element of the motor can be coupled to the carrier element and configured to move the carrier element along the guide. The restraint can be configured to selectively engage the guide to restrain movement of the carrier element in at least one direction along the guide when the guide is inclined out of the horizontal reference plane. The actuator can be configured to displace the carrier element relative to the restraint along the guide when the restraint is engaged with the guide.

In some embodiments, the guide can be a linear guide further comprising a linear bearing comprising a first end portion and a second end portion. When the linear bearing is inclined out of the horizontal reference plane, the second end portion can be spaced apart from the first end portion along a first axis parallel to the horizontal reference plane, and the second end portion can be spaced apart from the first end portion along a second axis that is perpendicular to the horizontal reference plane such that the second end portion is higher than the first end portion.

In some embodiments, the actuator and the restraint can be positioned between the first end portion of the linear bearing and the carrier element, and the actuator can be configured to push the carrier element toward the second end portion of the linear bearing.

In some embodiments, the actuator element can be positioned between the carrier element and the second end portion of the linear bearing and can be configured to pull the carrier element toward the second end portion of the linear bearing.

In some embodiments, the system further comprises a biasing member disposed between the restraint and the carrier element. The biasing member can be configured to bias the carrier element against the actuator at least whenever the restraint is engaged with the guide.

In some embodiments, the biasing member can be configured to move the restraint toward the carrier element when the restraint is disengaged from the guide.

In some embodiments, the restraint can be a first restraint coupled to a first end portion of the carrier element, and the system can further comprise a second restraint coupled to a second end portion of the carrier element.

In some embodiments, the actuator comprises a piezoelectric actuator movable between a contracted configuration and an expanded configuration.

In some embodiments, the positioning system can further comprise one or more flexure elements. The flexure elements can be coupled to the restraint and engaged with the carrier element. The flexure elements can be configured to elastically deform in a direction along the axis of the guide to allow motion of the carrier element relative to the restraint and can be configured to resist deformation along axes perpendicular to the axis of the guide.

In some embodiments, the guide can be a rotary guide.

In a representative embodiment, a multi-beam system can comprise a scanning electron microscope (SEM), an ion column, and a positioning system as described above, situated to selectively position a workpiece for imaging with the SEM or to receive an ion beam from the ion column.

A representative method can comprise moving a carrier element along a guide with a motor, engaging the guide with a restraint coupled to the carrier element to restrain movement of the carrier element in at least one direction along the guide, and actuating an actuator disposed between the restraint and the carrier element to move the carrier element relative to the restraint along the guide. At least a mover element of the motor can be coupled to the carrier element, the carrier element can be inclined relative to a horizontal reference plane, the guide can be movable relative to the horizontal reference plane, and the carrier element can be configured to engage and convey a workpiece.

In some embodiments, the motor is a linear motor, and moving the carrier element along the guide further comprises energizing the linear motor and moving the mover element. The method can further comprise prior to actuating the actuator, de-energizing the linear motor.

In some embodiments, the method can further comprise using a position encoder coupled to the carrier element to determine a position of the carrier element along the guide, and actuating the actuator to move the carrier element from the determined position to a target position along the guide.

In some embodiments, the target position is a first target position, and the method can further comprise disengaging the restraint from the guide, actuating the actuator to move the restraint relative to the carrier element, and re-engaging the guide with the restraint to restrain the carrier element at a second target position.

In some embodiments, the actuator comprises a piezoelectric actuator.

In some embodiments, actuating the piezoelectric actuator can comprise applying a positive voltage to the piezoelectric actuator to move the piezoelectric actuator from a neutral configuration to an expanded configuration.

In some embodiments, actuating the piezoelectric actuator can comprise applying a negative voltage to the piezoelectric actuator to move the piezoelectric actuator from a neutral configuration to a contracted configuration.

In some embodiments, the method can further comprise imaging a workpiece coupled to the carrier element with a scanning electron microscope (SEM), actuating the actuator to reposition the carrier element and the workpiece along the guide with respect to the SEM, and imaging the workpiece with the SEM a second time.

In a representative embodiment, a system can comprise a guide, a carrier element coupled to the guide, a motor comprising a mover element, a restraint coupled to the carrier element and configured to selective engage the guide, an actuator disposed between the restraint and the carrier element, and a controller. The guide can be movable relative to a horizontal reference plane such that the carrier element is inclined with respect to the horizontal reference plane. The carrier element can be configured to engage and convey a workpiece. At least the mover element can be coupled to the carrier element. The controller can be configured to transmit control signals to the motor to move the carrier element along the guide, transmit control signals to the restraint to engage the guide to restrain movement of the carrier element in at least one direction along the guide, and transmit control signals to the actuator to actuate the actuator to move the carrier element relative to the restraint along the guide.

The foregoing and other objects, features, and advantages of the disclosure will become more apparent from the following detailed description, which proceeds with reference to the accompanying figures.

BRIEF DESCRIPTION OF THE DRAWINGS

FIG. 9 is a schematic block diagram of a representative embodiment of a control system.

FIG. 10 is a flow diagram of a representative method for positioning a carrier element using a position-setting assembly.

DETAILED DESCRIPTION

The present disclosure concerns systems and methods for moving carrier elements, such as wafer stage assemblies, for example, along inclined axes and/or along rotary axes where elements of the system are subject to asymmetric loads. The systems described herein can allow a workpiece such as a semiconductor wafer to be accurately positioned with respect to one or more tools (e.g., a scanning electron microscope (SEM), ion column, laser beam, etc.) in a process chamber (e.g., a vacuum chamber) where, due to space constraints, the tools may be positioned at various angles. For example, certain systems described herein can comprise piezo-actuated restraints or brake mechanisms configured to quickly engage braking rail members or other elements of a guide (such as a linear or rotary guide), in combination with piezoelectric actuators configured to push or pull a bulk stage such as a wafer chuck along the guide relative to the restraint. When, for example, the bulk stage is inclined out of a horizontal reference plane, such systems can facilitate precisely positioning the bulk stage (and the workpiece thereon) along the inclined axis, allowing the system to compensate for asymmetric loads on motors, brakes, etc., that may result in degradation of positional accuracy in existing systems. Such systems can also be used with rotary guides to facilitate precisely positioning the bulk stage (and the workpiece thereon) at a selected angle relative to tools of a multi-beam system.

Figure 1:
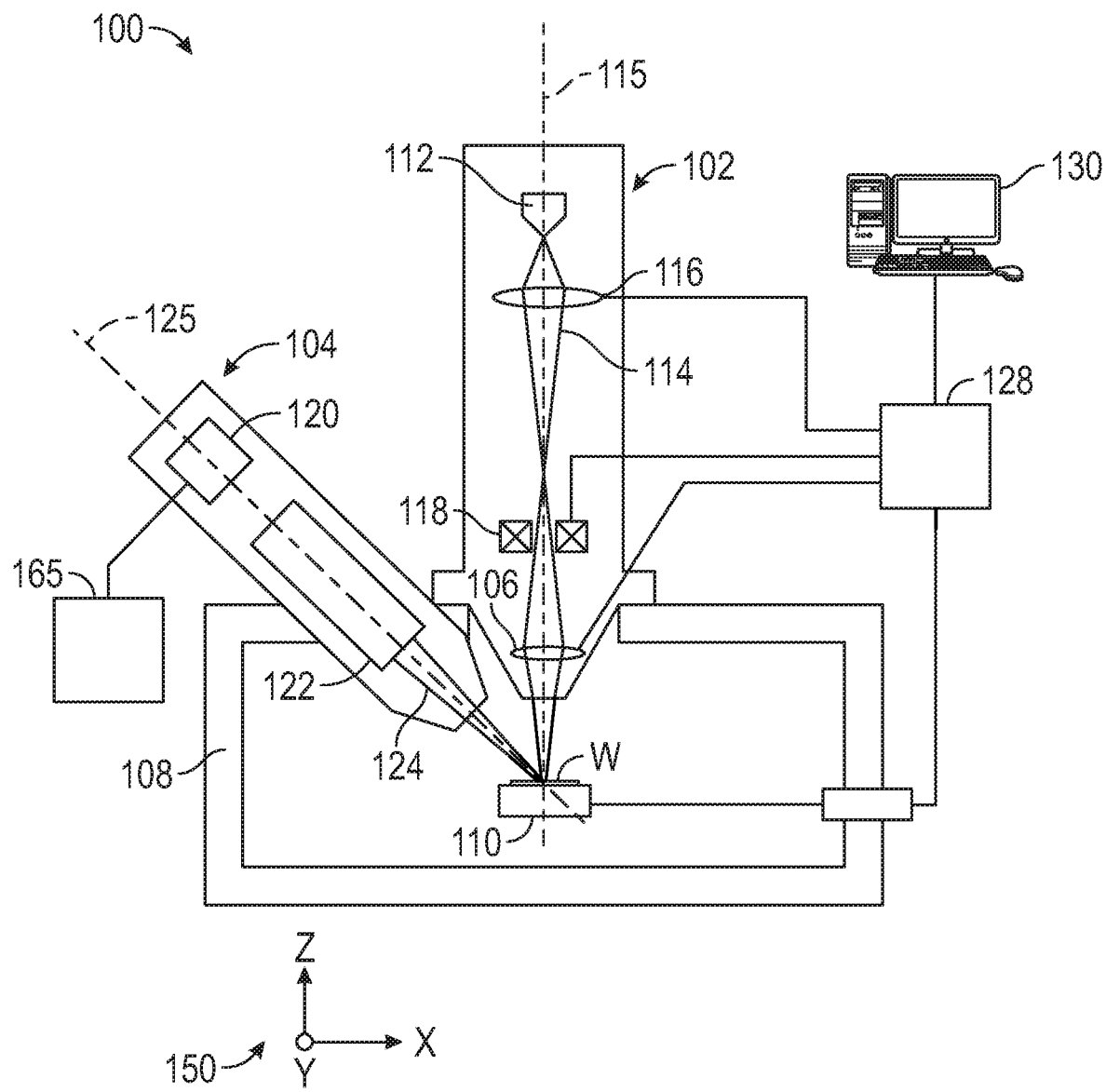
FIG. 1 illustrates a representative embodiment of a dual-beam system.

Referring to FIG. 1, in a representative embodiment, a multi-beam system can be configured as a dual-beam system 100 comprising a scanning electron microscope (SEM) 102 and an ion beam column 104. The SEM 102 can comprise one or more charged particle beam (CPB) lenses such as a condenser lens 116 and an objective lens 106. In some embodiments, one or more CPB lenses can be magnetic lenses, and particularly, the objective lens 106 can be a magnetic objective lens. The ion beam column is arranged to provide a focused ion beam (FIB) to a workpiece W, and the SEM 102 is situated for production of an image of the workpiece W.

The SEM 102 and the ion beam column 104 can be mounted to a vacuum chamber 108 housing a movable positioning system 110 for holding the workpiece W. The vacuum chamber 108 can be evacuated using vacuum pumps (not shown). As discussed in further detail below, the positioning system 110 can be movable along the X-, Y-, and Z-axes as shown with respect to a coordinate system 150, wherein the Y-axis is perpendicular to the plane of the page.

In some embodiments, the SEM 102 can be arranged vertically above the workpiece W and can be used to image the workpiece W, and the ion beam column 104 can be arranged at an angle and can be used to machine and/or process the workpiece W. FIG. 1 shows an exemplary orientation of the SEM 102 and the ion beam column 104.

The SEM 102 can comprise an electron source 112 and can be configured to manipulate a "raw" radiation beam from the electron source 112 and perform upon it operations such as focusing, aberration mitigation, cropping (using an aperture), filtering, etc. The SEM 102 can produce a beam 114 of input charged particles (e.g., an electron beam) that propagates along a particle-optical axis 115. The SEM 102 can generally comprise one or more lenses (e.g., CPB lenses) such as the condenser lens 116 and the objective lens 106 to focus the beam 114 onto the sample S. In some embodiments, the SEM 102 can be provided with a deflection unit 118 that can be configured to steer the beam 115. For example, the beam 114 can be steered in a scanning motion (e.g., a raster or vector scan) across a sample being investigated.

The dual-beam system 100 can further comprise a computer processing apparatus and/or a control unit 128 for controlling, among other things, the deflection unit 118, charged particle beam (CPB) lenses 106, 116, and detectors (not shown), and for displaying information gathered from the detectors on a display unit. In some cases, a control computer 130 is provided to establish various excitations, record imaging data, and generally control operation of both the SEM and the FIB.

Referring still to FIG. 1, the ion beam column 104 can comprise an ion source (e.g., a plasma source 120) and ion beam optics 122. In the illustrated embodiment, the ion beam column 104 is a plasma focused ion beam (PFIB), however, in other embodiments, the ion beam column 104 can be a standard focused ion beam (FIB) having a liquid metal ion source (LMIS), or any other ion source compatible with a focused ion beam column. The ion beam column 104 can produce and/or direct the ion beam 124 along an ion-optical axis 125. As mentioned above, the ion column 104 can be used to perform imaging, processing and/or machining operations on the workpiece, such as incising, milling, etching, depositing, etc.

In embodiments wherein the ion beam is a PFIB, the ion source 120 can be fluidly coupled to a plurality of gases via a gas manifold 165 that includes gas sources coupled by respective valves to the ion source 120. During operation of the ion source 120, a gas can be introduced, where it becomes charged or ionized, thereby forming a plasma. Ions extracted from the plasma can then be accelerated through the ion beam column 104, becoming an ion beam. In other embodiments, the system 100 can comprise one or more lasers, or other types of milling or diagnostic tools.

Figure 2:
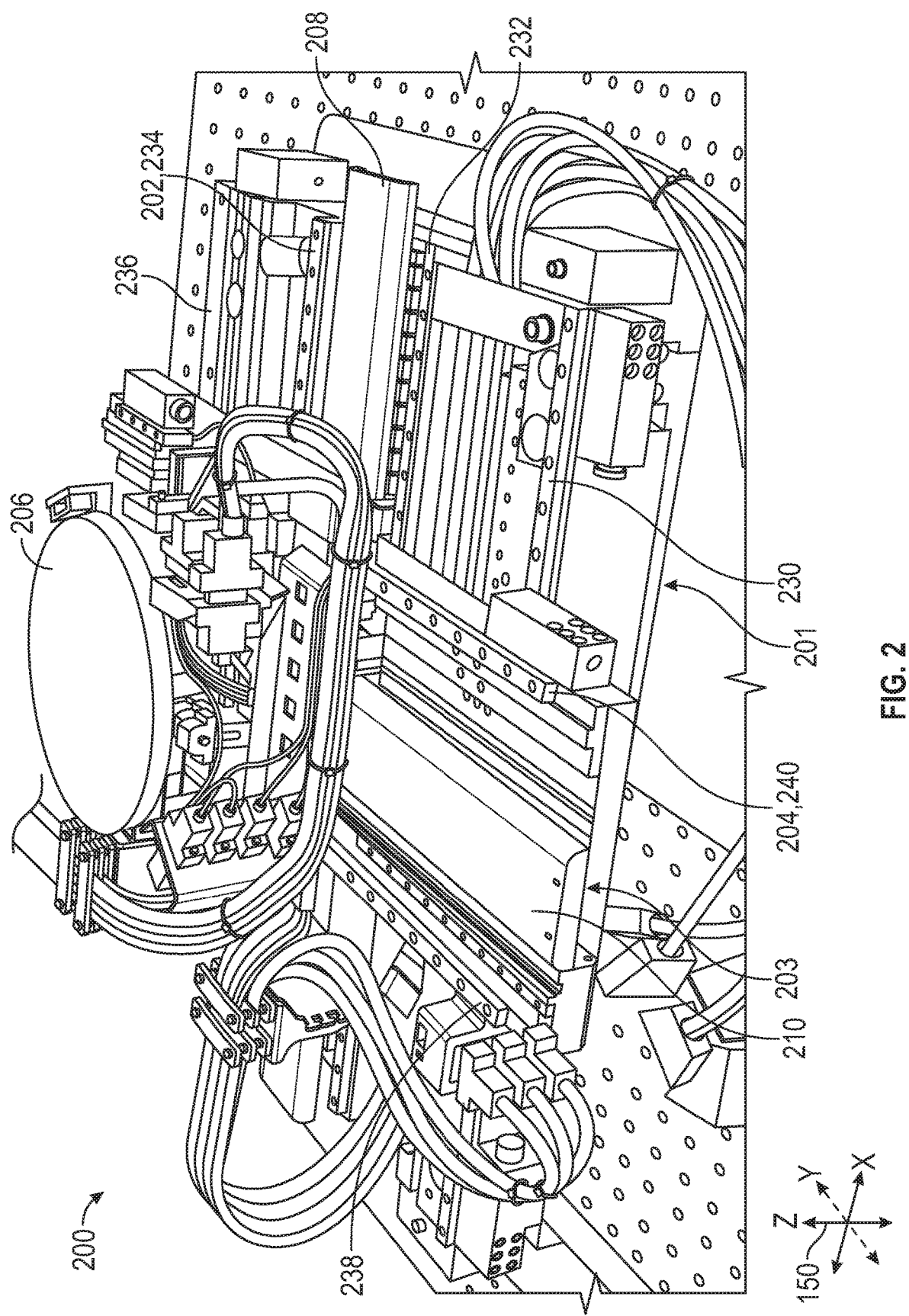
FIG. 2 illustrates a perspective view of a representative embodiment of a positioning system.

As mentioned above, such multi-beam systems can comprise a positioning system configured to hold and position the workpiece W. In some embodiments, the positioning system can be a 4-axis positioning system configured to position the workpiece along at least three linear axes (e.g., the X-, Y-, and Z-axes, as shown with respect to coordinate system 150) and around at least one rotational axis (e.g., rotation about an axis extending perpendicularly through the workpiece). As used herein, unless stated in absolute terms such as "completely perpendicular," the term "perpendicular" includes the term "substantially perpendicular." For example, an object is substantially perpendicular with respect to a reference object or plane when the object is oriented at an angle between 110° and 70° with respect to the reference object or plane. FIG. 2 shows an exemplary 4-axis positioning system 200 comprising a base element 201, a carriage assembly 203, and a carrier element 206.

The base element 201 can comprise a first guide 202. As used herein, the term "guide" refers to a component, or system of components, that direct, control, or guide motion of an object along a particular axis, or about a particular axis. Thus, "linear guides" direct or guide translation or linear motion along selected axes, while "rotary guides" or "rotational guides" direct rotation or angular motion about selected axes. Thus, the first guide 202 can be configured as a linear guide extending parallel to the X-axis. The carriage assembly 203 can be coupled to the base element 201 such that it can translate along the first linear guide 202. The carriage assembly 203 can comprise a second linear guide 204 extending parallel to the Y-axis. The carrier element 206 can be coupled to the carriage assembly 203 such that it can translate along the second linear guide 204. By overlapping two linear (translational) movements, the workpiece can be moved in the X-Y plane. The carrier element 206 can further be configured to translate along an axis parallel to the Z-axis (e.g., up and down in the orientation shown in FIG. 2), and to rotate about an axis extending perpendicularly through the carrier element 206.

Each linear guide 202, 204 can comprise one or more of a variety of extendable or non-extendable linear members or elements, including but not limited to: rails, telescoping members, brake guides or strips, linear guideways or bearings (such as roller, ball, or needle linear guideways), and/or any combinations thereof. For example, in the illustrated embodiment the linear guide 202 can comprise a first linear bearing 230, a second linear bearing 232, a third linear bearing 234, and a fourth linear bearing 236 spaced apart from each other along the Y-axis. The linear guide 204 can comprise a first linear bearing 238, and a second linear bearing 240 spaced apart from each other along the X-axis.

The linear guide 202 can comprise a motor 208, and the linear guide 204 can comprise a corresponding motor 210. The motor 208 can translate the carriage assembly 203 along the first linear guide 202, and the motor 210 can translate the carrier element 206 along the second linear guide 204. In the illustrated example, the motors 208 and 210 are configured as linear motors, such as linear induction motors. However, in other embodiments, the motors can be, for example, piezoelectric motors, rotary electric motors (e.g., brushless direct current (BLDC) motors) comprising rack and pinion gears, or combinations thereof.

In some embodiments, the positioning system 200 can comprise one or more additional motors (not shown), such as servo motors (e.g., brushless AC motors, BLDC motors, stepper motors, etc.). The additional motors can be configured to, for example, translate the carrier element 206 in a direction parallel to the Z-axis, and/or rotate the carrier element 206 about one or more axes of the system, such as an axis extending perpendicularly through the carrier element 206.

Figure 6:
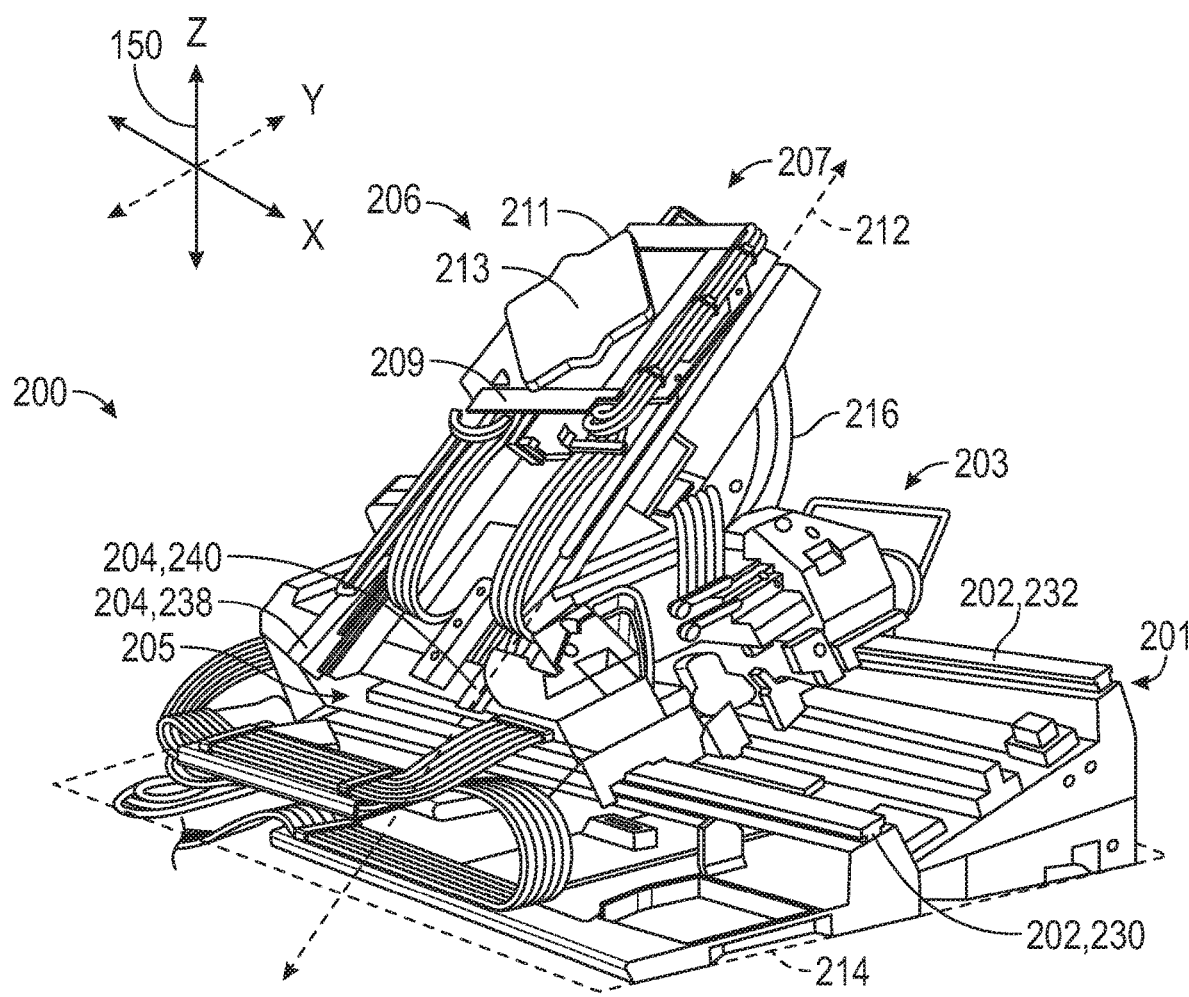
FIG. 6 illustrates a perspective view of a representative embodiment of another positioning system.
Figure 7:
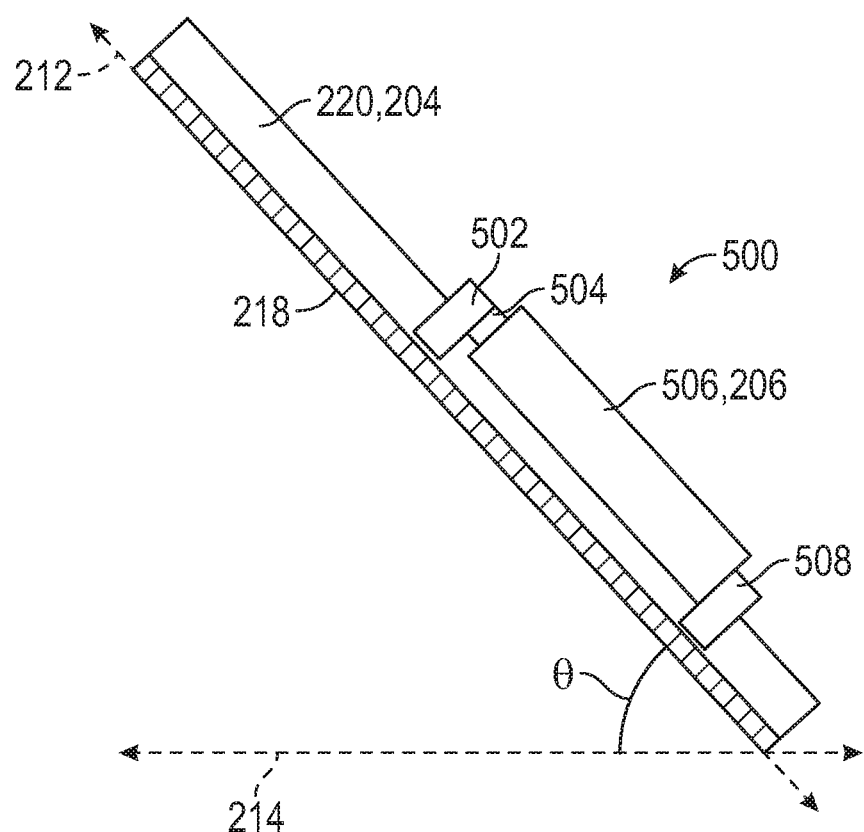
FIG. 7 illustrates a side elevation view of a representative embodiment of a position-setting assembly mounted on a linear guide.

In some embodiments, the linear guides 202, 204 can further comprise one or more guide members or restraint guides 220 (see FIGS. 6 and 7). Each motor 208, 210 can have one or more corresponding restraint guides 220. In some embodiments, one or more of the linear bearings (e.g., bearings 230, 232, 234, 236, 238, 240) can function as restraint guides 220. In other embodiments, each restraint guide can be a separate linear guide (e.g., a separate rail, telescoping member, brake guide or strip, linear guideway or bearing (such as a roller, ball, or needle linear guideway)) extending parallel to the linear bearings of the first or second linear guide 202, 204, respectively. One or more restraints can be coupled to the carrier element 206 and can be configured to selectively engage the restraint guide 220 to restrain movement of the carrier element in at least one direction along the restraint guide 220.

Figure 3:
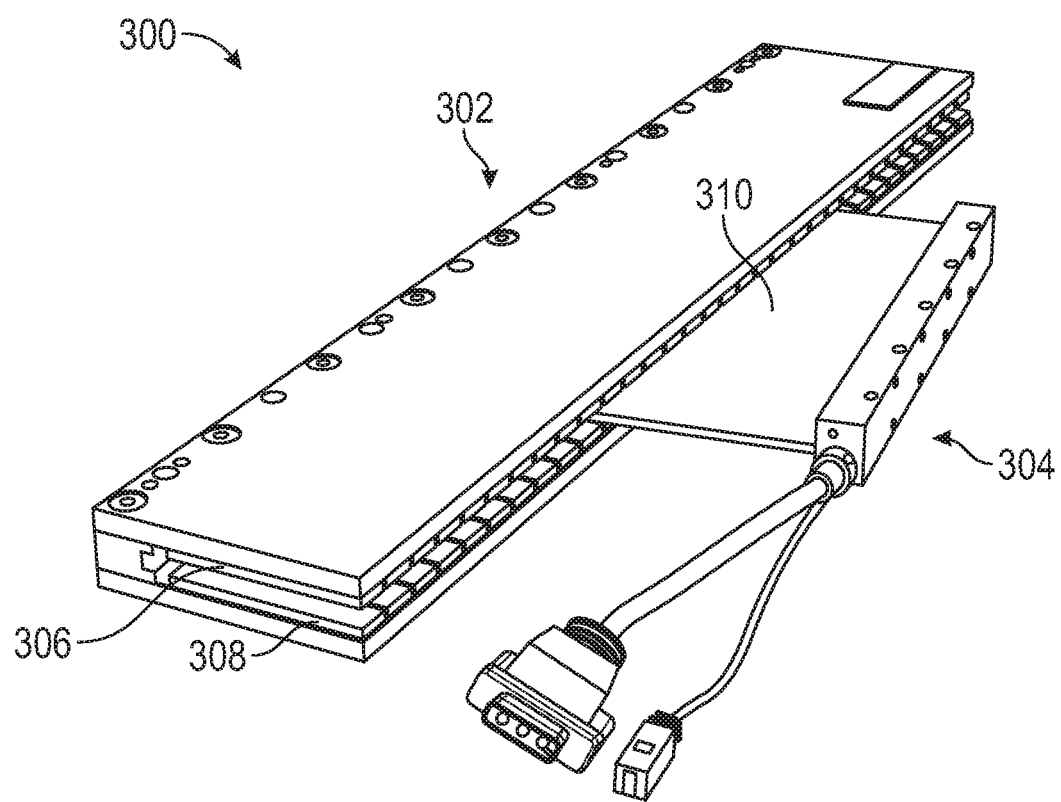
FIG. 3 illustrates a perspective view of a representative embodiment of a linear motor.

FIG. 3 illustrates a representative embodiment of a linear motor 300 such as may be used in combination with any of the positioning systems described herein. The linear motor 300 can include a stationary stator generally indicated at 302, and a drive mechanism or mover (also referred to as a "mover element") 304, that is movable with respect to the stator along an axis defined by the length of the stator. The stator 302 can comprise a first set of magnets 306 arrayed along an inner top surface of the housing, and an opposing second set of magnets 308 arrayed along an inner lower surface of the housing such that the magnet arrays form a channel between them. In certain embodiments, the magnet arrays 306 and 308 can be arranged such that the polarity of successive magnets alternates along the length of the stator 302 (e.g., north, south, north south, etc.), and such that each magnet of the first set of magnets 306 corresponds to a magnet of opposite polarity of the second set of magnets 308. In certain embodiments, the magnets 306 and 308 can comprise coils that produce magnetic fields when current is applied (also referred to as being "energized"). The mover 304 can comprise a third set of magnets 310. The third set of magnets 310 can extend into the channel formed between the first and second sets of magnets 306, 308, and can be propelled along the stator 302 by interaction with the magnet arrays 306 and 308.

Figure 4:
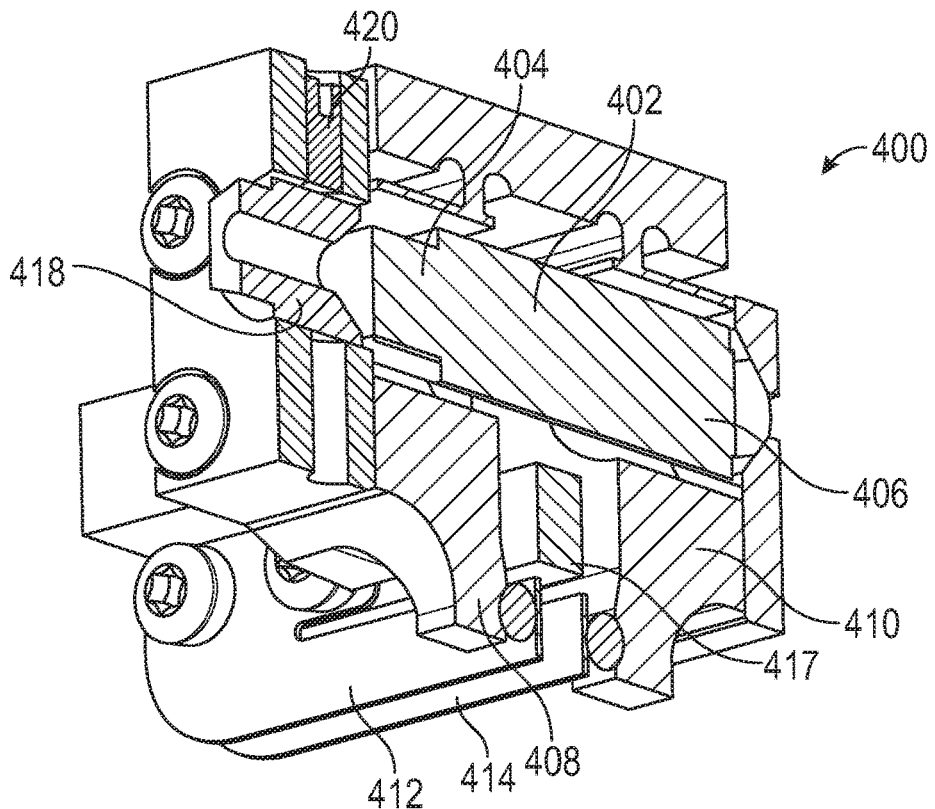
FIG. 4 illustrates a perspective view of a representative embodiment of a restraint.
Figure 5:
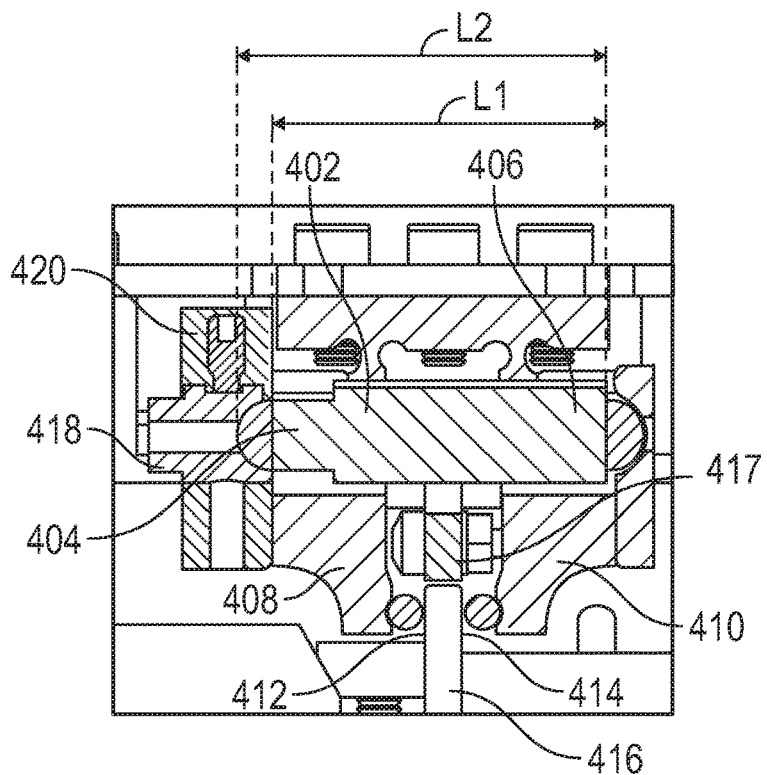
FIG. 5 illustrates an end-on, cross-sectional view of the restraint of FIG. 4 shown mounted on a linear guide.

FIGS. 4-5 illustrate an exemplary embodiment of a restraint 400 configured as a brake assembly, and which can be coupled to the carrier element 206. The restraint 400 can have a first, engaged configuration wherein the restraint 400 is restrained from movement relative to a rail member 416 (see e.g., FIG. 5), and a second, disengaged position wherein the restraint 400 is movable relative to (e.g., along) the rail member 416. The rail member 416 can be a component of a linear guide, such as linear guides 202 and 204 comprising one or more linear bearings, or the rail member 416 can be part of a rotary guide, for example, rotary guide 216 as shown in FIG. 6.

The restraint 400 can comprise an expansion member or actuator member 402 having a first end portion 404 and a second end 406, a first clamping member 408 coupled to the first end portion 404, and a second clamping member 410 coupled to the second end portion 406. The restraint 400 can further comprise two opposing flexible elements 412, 414 configured to be disposed on either side of the rail member 416 and mounted to a mounting member 417 extending parallel to and above the rail member. Each clamping member 408, 410 can contact a respective flexible element 412, 414.

The expansion member 402 can be configured to move between a first or neutral configuration having a first length $L_1$, and a second, or expanded configuration having a second length $L_2$. $L_2$ can be greater than $L_1$. In some embodiments, the expansion member 402 can comprise a piezoelectric actuator (e.g., configured as a stack of piezoelectric disks referred to as a "piezoelectric stack") configured to move from the neutral configuration to either the expanded configuration or the contracted configuration when the expansion member 402 is energized (e.g., by applying a voltage). For example, the expansion member 402 can move from the neutral configuration to the expanded configuration when a positive voltage is applied. In a particular example, the piezoelectric stack can expand by 30 μm when 200V DC is applied. Piezoelectric stacks are discussed in more detail below with reference to actuator 504.

In some embodiments, the expansion member 402 can be movable to a third, or contracted configuration having a third length, in order to increase the clamping force of the restraint 400. The third length can be less than the first length $L_1$. The expansion member 402 can move from the expanded configuration and/or the neutral configuration to the contracted configuration when a negative voltage is applied. In other embodiments, the expansion member 402 can comprise any of a variety of other linear actuators, such as voice coil motors, screw actuators, etc.

In the illustrated embodiment, the expansion member 402 has a stepped, cylindrical shape wherein the first end portion 404 has a first diameter and the second end portion 406 has a second diameter. However, in other embodiments, the expansion member can be a cylinder having a uniform diameter along its length. In still other embodiments, the expansion member can have any shape, including but not limited to rectangular, etc., depending upon the particular characteristics desired.

In the illustrated embodiment, the restraint 400 is configured as a passive restraint such that when the expansion member 402 is in the neutral configuration, as shown in FIGS. 4-5, the restraint is in the engaged configuration and movement of the restraint is prevented. In other words, when the restraint 400 is in the default state with no voltage applied, the clamping members 408, 410 deflect the members 412 and 414 inwardly toward the rail member 416 such that they pinch or clamp the rail member 416. When voltage is applied such that the expansion member 402 moves to the expanded configuration, the restraint is in the disengaged configuration such that the first and second end portions 404, 406 apply a force (e.g., a pushing force) to the clamping members 408, 410. This moves the clamping members 408, 410 away from the flexible elements 412, 414, disengaging them from the rail member 416, and allowing movement of the restraint 400 relative to the rail member 416.

In other embodiments, the restraint 400 can be configured as an active restraint such that actuation of the expansion member 402 causes the clamping members 408, 410 to apply a pinching or clamping force to the flexible elements 412, 414, which in turn can apply a clamping force to the rail member 416.

In some embodiments, the restraint 400 can further comprise an adjustment element 418 and a locking mechanism 420 for holding the adjustment element 418 in place. The adjustment mechanism 418 can be adjusted to vary the distance between the first and second flexible elements 412, 414, for example, in order to vary the frictional fit of the restraint 400 against rail member 416.

In some embodiments (such as shown in FIG. 2), the carrier element 206 can be disposed perpendicularly to the Z-axis. This allows the electron beam to impinge on the workpiece W at an angle perpendicular to the surface of the workpiece W. However, because in a multi-beam system the instruments are positioned at an angle with respect to one another (such as shown in FIG. 1 where the ion column is positioned at an angle to the SEM), one or more of the instruments may not impinge the workpiece perpendicularly, but rather at an angle, which may result in inhomogeneous treatment of the workpiece W. For example, in a milling treatment, a side of the workpiece facing the ion beam may be thinned to a greater extent than an opposite side of the workpiece. Thus, in certain applications, it can be advantageous to position the workpiece perpendicular to, substantially perpendicular to, or at a small angle relative to the ion beam column or another instrument.

The following examples are described with reference to linear guides for purposes of illustration. However, the disclosed systems are also applicable to rotary guides, such as curved guides and associated motors, to effect rotational motion of any part of the system about a selected axis.

FIG. 6 shows another representative embodiment of positioning system 200 wherein the second linear guide 204, the motor 210 (see FIG. 2), and the carrier element 206 can move, rotate, or tilt out of a horizontal reference plane 214. In some embodiments, the horizontal reference plane 214 can extend through the base element 201 of the positioning system (e.g., the X-Y plane), such that an axis 212 defined by the linear guide 204 is inclined relative to the horizontal reference plane. As described previously, the system 200 can be movable along the X-, Y-, and Z-axes, respectively, as shown with respect to the coordinate system 150. In the illustrated embodiment, linear guide 202 has two linear bearings 230, 232 extending parallel to the X-axis, and linear guide 204 has two linear bearings 238, 240 extending parallel to the Y-axis.

The linear guide 204 can have a first end portion 205 displaced or spaced apart from a second end portion 207 along two axes, for example, the Y- and Z-axes. The first end portion 205 can be spaced apart from the second end portion 207 along the Y-axis and the second end portion 207 can be spaced apart from the first end portion 205 along the Z-axis, such that the linear guide 204 is inclined. The carrier element 206 can have a first end portion 209 oriented toward the first end portion 205 of the linear guide 204 and a second end portion 211 oriented toward the second end portion 207 of the linear guide 204.

The second linear guide 204, the motor 210, and the carrier element 206 can be rotated using a rotary guide 216, which can rotate to adjust the angle θ of incline (see e.g., FIG. 7). In some embodiments, θ can be between 0 degrees and approximately 90 degrees. In other embodiments, θ can be between 15 degrees and 80 degrees, between 30 degrees and 60 degrees, between 45 degrees and 90 degrees. In some particular embodiments, θ can be 15 degrees, 30 degrees, 45 degrees, or 60 degrees.

The positioning system 200 can comprise one or more position-setting, position-keeping, or station-keeping assemblies 500 (see e.g., FIG. 7) configured to set or maintain the carrier element 206 at a selected position along a guide, for example, linear guide 204. More particularly, the linear guide 204 can comprise linear bearings 238, 240, described above, and can further comprise linear bearing 220. In some embodiments, the linear bearing 220 can be configured as one of the linear bearings 238, 240, however, in other embodiments linear bearing 220 can be configured as a separate linear bearing extending parallel to linear bearings 238, 240.

The one or more position-setting assemblies can be coupled to the carrier element 206. In some embodiments, the carrier element 206 can comprise a single position-setting assembly 500 coupled to the first end portion 209 or the second end portion 211 of the carrier element 206. In other embodiments, the carrier element can comprise one or more position-setting assemblies 500. For example, the carrier element 206 can comprise a first position-setting assembly located at the first end portion 209 and a second position-setting assembly at the second end portion 211.

FIG. 7 illustrates an exemplary position-setting assembly 500 slidably coupled to a guide configured as a linear bearing 220. Position-setting assembly 500 can comprise a restraint 502 similar to restraint 400, an actuator 504, a drive mechanism 506 (e.g., such as the mover of the motor 210), and a position encoder 508 configured to determine the position of the carrier element 206 based on an encoder scale 218 coupled to or formed integrally with linear bearing 220. The drive mechanism 506 can be coupled to the carrier element 206 of the positioning system 200 such that the carrier element 206 can be translated along linear bearing 220.

The actuator 504 can be actuatable between a neutral configuration having a first length, an expanded configuration having a second length, and a contracted configuration having a third length. The second length can be greater than the first length, which can be greater than the third length. The application of voltage (positive and/or negative) can be used to move the actuator 504 between the neutral configuration, the expanded configuration, and the contracted configuration. The actuator can be actuated to adjust the position of the carrier element by a relatively small distance (e.g., on the order of 1-100 μm) or to adjust the position of the carrier element by a larger distance, using iterative smaller movements, as described in more detail below.

In some embodiments, the actuator 504 can remain energized throughout use of the multi-beam system in order to maintain the carrier element 206 at the selected position. The voltage applied to the actuator 504 can be locked (e.g., a constant DC voltage can be applied) such that the actuator provides little or no mechanical or electrical noise during imaging and/or processing.

Figure 8:
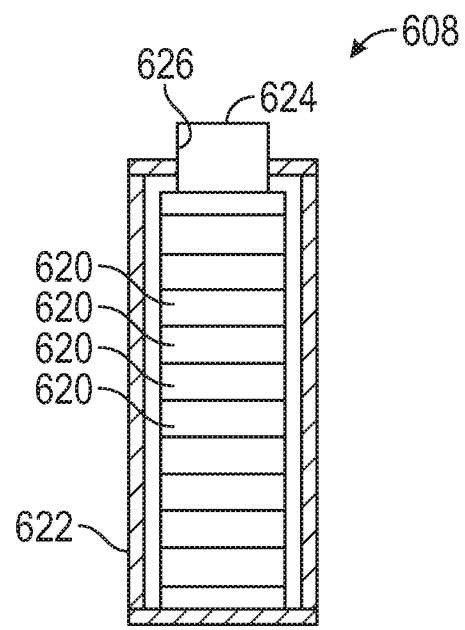
FIG. 8 is a cross-sectional side elevation view of a representative embodiment of a piezoelectric actuator.

In the illustrated embodiment, the actuator 504 comprises a piezoelectric actuator configured as a piezoelectric stack. As shown in FIG. 8, an exemplary actuator 600 can comprise a plurality of piezoelectric elements 602 adjacent one another and at least partially contained within a housing 604. In some embodiments, each pair of elements can have a respective electrode between them configured to apply a voltage to the elements. An extension portion 606 can be coupled to one end of the plurality of piezoelectric elements. The housing 604 can comprise an opening 608, through which the extension portion 606 can extend. When a voltage is applied to the plurality of piezoelectric elements 602, they can move from a neutral or contracted configuration to an expanded configuration (e.g., when a positive voltage is applied) and/or move from a neutral or expanded configuration to a contracted configuration (e.g., when a negative voltage is applied). The expansion and/or contraction of the piezoelectric elements 602 causes corresponding movement of the extension portion 606 relative to the housing.

The actuator 504 (and the expansion member 402 of the restraint 400, described above) can comprise one or more piezoelectric materials including but not limited to ceramics (including naturally occurring and synthetic ceramics), crystals (including naturally occurring and synthetic crystals), group III-V and II-VI semiconductors, polymers, organic nanostructures, or any combinations thereof. Piezoelectric materials can expand when a positive voltage is applied and contract when a negative voltage is applied. The amount and speed of contraction and/or expansion can be dependent on the magnitude of the applied voltage.

Referring again to FIG. 7, in the illustrated embodiment, the position-setting assembly 500 is coupled to the second end portion 211 of the carrier element 206 (e.g., above the carrier element in the orientation shown in FIG. 7). However, in other embodiments (such as the embodiment shown in FIG. 13), the position-setting assembly can be coupled to the first end portion 209 of the carrier element 206 (e.g., below the carrier element in the orientation shown in FIG. 7). In still other embodiments, the positioning system 200 can comprise two or more position-setting assemblies 500 that can be coupled, for example, to the first end portion 209 and the second end portion 211 of the carrier element 206, respectively.

In some embodiments, the positioning system 200 can further comprise a controller 700 configured to control one or more components of the positioning system 200, including the one or more position-setting assemblies.

Referring now to FIG. 9, in an exemplary operation, the controller 700 can receive an input from the position encoder 508. The input can be, for example, position data comprising the position of the carrier element 206. The controller 700 can compare the position data to the selected position 702. If the position data does not match the selected position, the controller can actuate one or more components of the positioning system, including but not limited to, the restraint 502, the drive mechanism 506, and/or the actuator 504 in order to adjust the position of the carrier element 206 along the linear guide. In some cases, the controller 700 can function iteratively, by, for example, receiving first position data from the position encoder 508 and comparing the first position data to the selected position. If the controller 700 determines that the first position data does not match the selected position, the controller can actuate at least one of the restraint 502, the drive mechanism 506, and/or the actuator 504 in order to adjust the position of the carrier element 206 to a second position. The controller can then receive second position data from the position encoder 508 and can compare the second position data to the selected position. If the controller determines that the second position data does not match the selected position, the controller can actuate at least one of the restraint 502, the drive mechanism 506, and/or the actuator 504 in order to adjust the position of the carrier element 206. These iterative movements can continue until the controller 700 determines that the carrier element 206 has reached the selected position 702.

With reference to FIG. 10, a representative method 800 of positioning the carrier element 206 comprises moving the carrier element 206 along a guide (such as linear guide 204) with a motor (e.g., motor 210), at least a mover element of the motor being coupled to the carrier element, the carrier element being inclined relative to a horizontal reference plane, the guide being movable relative to the horizontal reference plane, the carrier element 206 being configured to engage and convey a workpiece. At 804, the guide can be engaged using the restraint 504 coupled to the carrier element 206 to restrain movement of the carrier element in at least one direction along the guide. At 806 the actuator disposed between the restraint and the carrier element can be actuated to move the carrier element relative to the restraint along the guide.

Figure 11A:
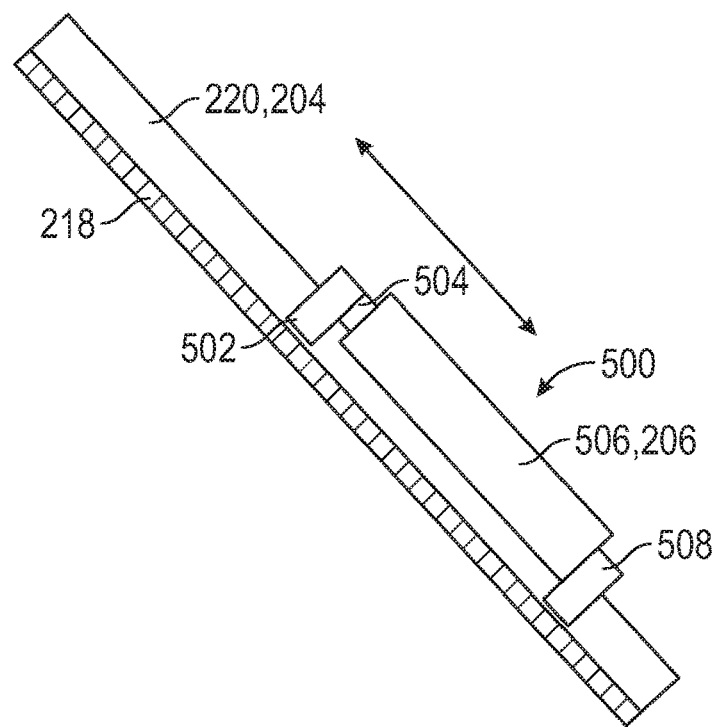
FIGS. 11A-11D illustrate an exemplary method for positioning a carrier element using a position-setting assembly.

Referring to FIGS. 11A-11D, the position-setting assembly 500 can be used or operated in the following exemplary manner when the linear guide and the carrier element are inclined. As shown in FIG. 11A, the restraint 502 can be disengaged from the linear bearing 220 (e.g., by energizing the expansion member 402 of the restraint 400 of FIG. 4) and the drive mechanism 506 can be activated to move the carrier element 206 to or toward a selected position along the linear bearing 220. The position encoder 508 can read the position of the position-setting assembly 500 using the encoder scale 218 and determine when the carrier element 206 has reached the selected position.

Figure 11B:
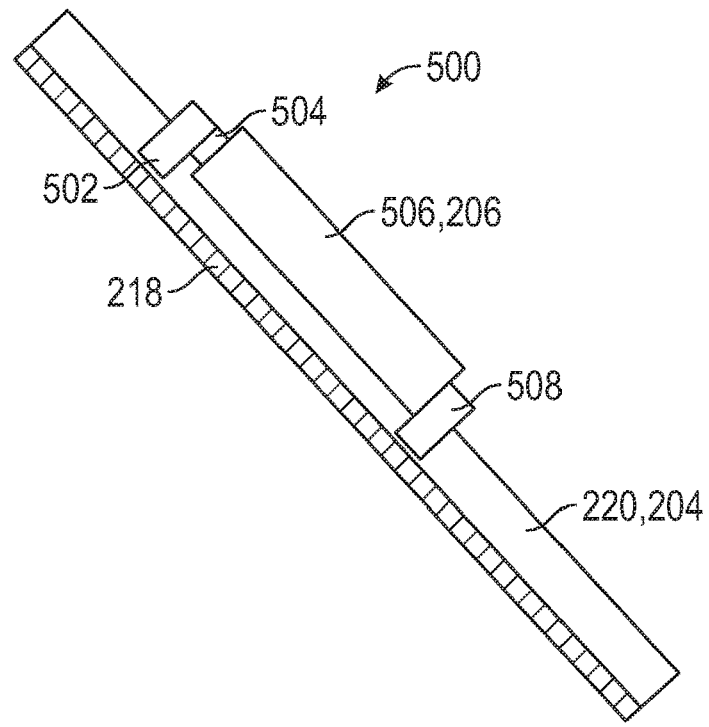
Figure 11C:
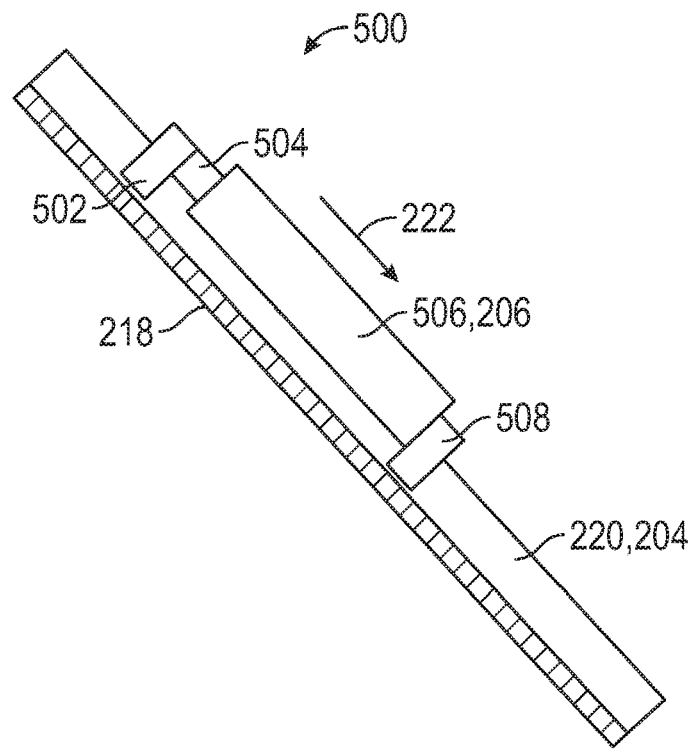

Once the carrier element 206 has reached the selected position, the drive mechanism 506 can be deenergized (e.g., by ceasing the flow of current to the motor) and the restraint 502 can be engaged (e.g., by deenergizing or removing the applied voltage from the expansion member), as shown in FIG. 11B. However, as shown in FIG. 11C, the transition between engaging the restraint 502 and deenergizing the drive mechanism 506 can result in minute changes in position (e.g., on the order of 1-5 μm), resulting in the carrier element 206 moving out of or away from the selected position to a second position, as shown by arrow 222. In some cases, the changes in position are caused by time delays between deenergizing the drive mechanism 506 and engaging the restraint 502. In other cases, since the restraint assembly 500 cannot be infinitely stiff, one or more components of the system may relax, stretch or compress, and/or backlash in the system can cause a change in position.

Figure 11D:
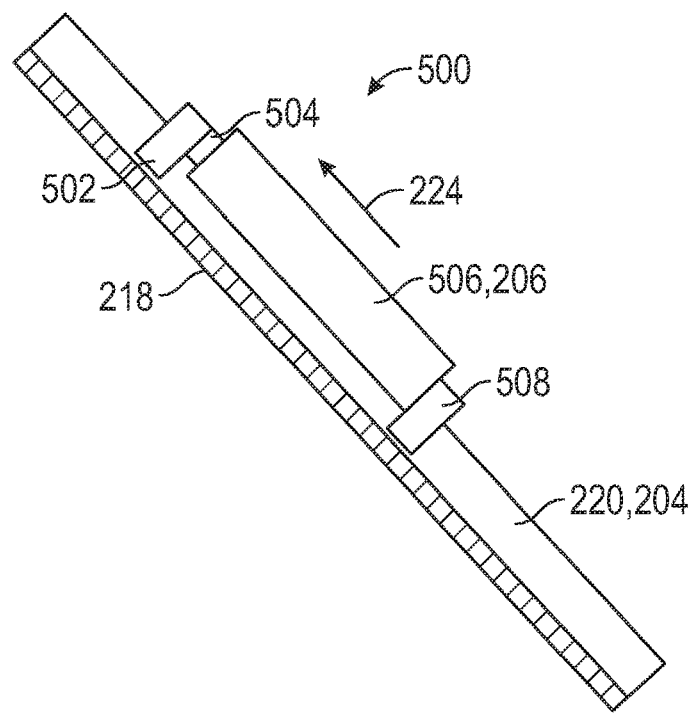

Referring to FIG. 11D, the actuator 504 can then be actuated (for example by applying a voltage to the actuator), to mitigate these changes in position. In the illustrated example, the actuator 504 can be contracted by applying a negative voltage to the actuator. The contraction of the actuator 504 applies a force (e.g., a pulling force) to the drive mechanism 506 (and therefore to the carrier element 206), causing the carrier element to move along the linear bearing 220 in an uphill position and return to the selected position as shown by arrow 224. The actuator 504 can remain in the contracted position (e.g., by maintaining the voltage applied to the actuator) until imaging and/or processing of the workpiece W has been completed.

In certain embodiments, relatively small adjustments in position can be made by varying (e.g., increasing or decreasing) the voltage applied to the piezo-actuator. This can allow, for example, the sequential positioning of specific features of a workpiece (such as a wafer) under a tool or diagnostic beam that are within the actuator's range of motion. For example, the carrier element 206 and therefore the workpiece W, can be moved to a first position such that a first feature (e.g., a transistor or other circuit element) of the workpiece is positioned in the beam of a scanning electron microscope (SEM). The SEM can then image the first feature. Once the first feature has been sufficiently imaged, the actuator 504 can be actuated (e.g., expanded) to move the carrier element 206 and workpiece W to a second position such that a second feature of the workpiece is positioned in the beam of the SEM. The SEM can then image the second feature. This sequence can be repeated in order to image any number of features located along the axis of motion.

Figure 12A:
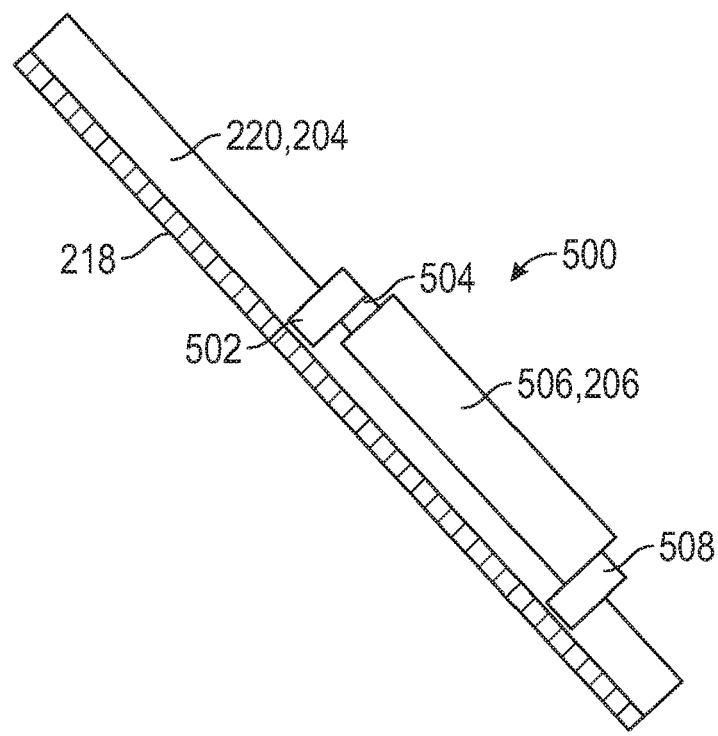
FIGS. 12A-12C illustrate another exemplary method for positioning a carrier element using a position-setting assembly.
Figure 12B:
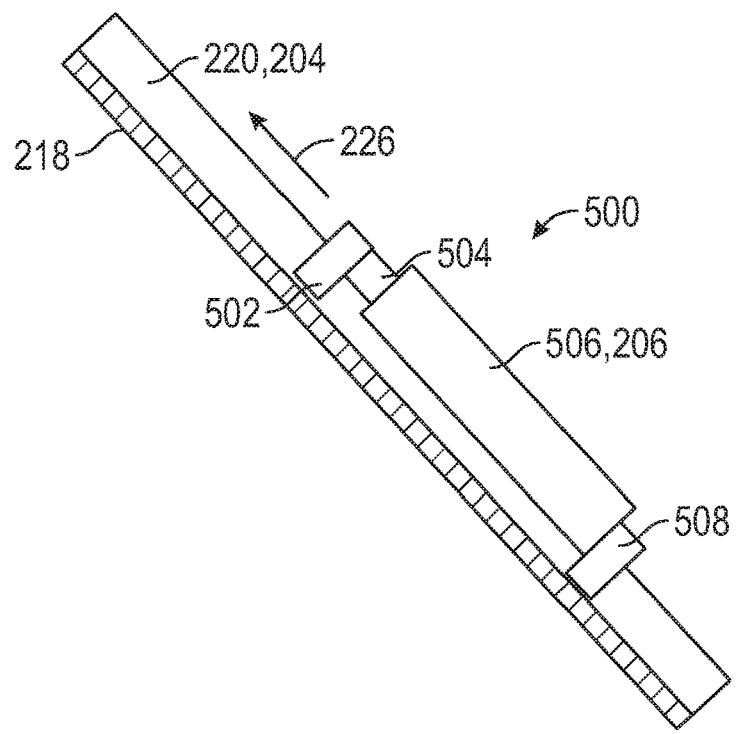
Figure 12C:
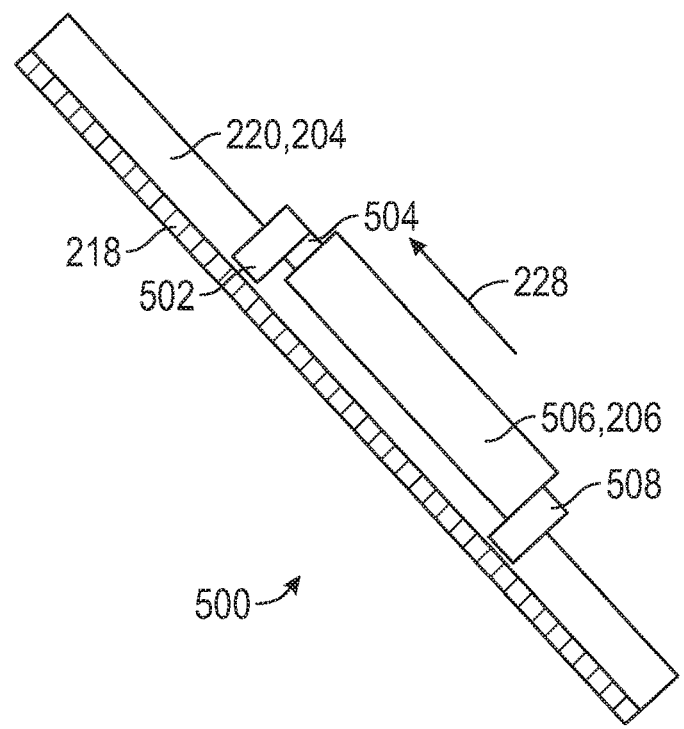

Referring to FIGS. 12A-12C, in some embodiments, the braking assembly 500 can be used to move the carrier element 206 from a first position to a second position. These movements can be referred to as "centering moves."

As shown in FIG. 12A, the drive mechanism 506 can move the carrier element 206 along the linear bearing 220 to a first position. Once in the first position, the restraint can be engaged and the drive mechanism 506 can be deenergized. To move the carrier element to a second position, as shown in FIG. 12B, the restraint 502 can be disengaged and the actuator 504 can be actuated (e.g., extended) to move the restraint 502 along the linear bearing 220 relative to the carrier element 206 (e.g., upwards along the linear guide in the orientation shown in FIG. 12B). As shown in FIG. 12C, the restraint 502 can then re-engage the linear bearing 220 and the actuator 504 can be actuated (e.g., contracted) to move the carrier element 206 relative to the restraint 502 (e.g., to pull the carrier element upwards toward the restraint 502 in the orientation shown in FIG. 12C).

Due to the relatively large mass or inertial stiffness of the carrier element 206, and the relatively high speed at which the actuator 504 (such as a piezo actuator) and the restraint 502 can be actuated, the carrier element 206 can be moved upwardly in increments along the linear bearing 220 without sliding down the linear bearing when the restraint is disengaged.

As noted above, in some embodiments, the position-setting assembly 500 can use iterative movements to move the carrier element a greater distance than would be possible with a single actuation of the actuator 504. For example, the drive mechanism 506 can position the carrier element at a first position along the linear guide 200. The drive mechanism 506 can then be deenergized and the restraint 502 can engage the linear bearing 220 to set the carrier element 206 at the first position. The restraint 502 can then be disengaged and the actuator 504 actuated to move the restraint relative to the carrier element 206. The restraint 502 can then be engaged and the actuator 504 can be actuated to move the carrier element 206 relative to the restraint 502, thus setting the carrier element at a second position. The restraint 502 can then once again be disengaged and the actuator 504 actuated to move the restraint relative to the carrier element 206. The restraint 502 can then be engaged and the actuator 504 can be actuated to move the carrier element 206 relative to the restraint 502, thus setting the carrier element at a third position. This sequence of actions can be repeated iteratively until the carrier element reaches a selected position uphill or downhill along the inclined linear guide.

The above methods are described with reference to a position-setting assembly 500 coupled to a second end portion 211 (e.g., an upper end portion in the orientation shown in FIGS. 11A-12C) of the carrier element 206. However, these methods can also be used with embodiments of the positioning system 200 where the position-setting assembly is coupled to the first end portion 209 of the carrier element 206, as described in further detail below.

In some embodiments, the positioning system 200 can comprise multiple position-setting assemblies configured similarly to the assembly 500, such as a first position-setting assembly at a first end portion 209 of the carrier element 206 and a second position-setting assembly at a second end portion 211 of the carrier element 206. In other words, the system can comprise position-setting assemblies on both sides of the carrier element 206. The first position-setting assembly can have a first restraint and a first actuator, and the second position-setting assembly can have a second restraint and a second actuator. In such embodiments, the position of the carrier element 206 can be set in the following exemplary manner.

The drive mechanism can move the carrier element 206 to a first position. The first restraint can engage the linear bearing 220. The first actuator can be actuated, thereby moving the carrier element along the guide rail relative to the first restraint to a second position. The second restraint can then engage the linear bearing 220, setting the carrier element 206 at the second position. The first restraint can then be disengaged, and the first actuator contracted to move the first restraint relative to the carrier element. The first restraint can then engage the linear guide and the sequence of actions can be repeated until the carrier element reaches a selected position.

Figure 13:
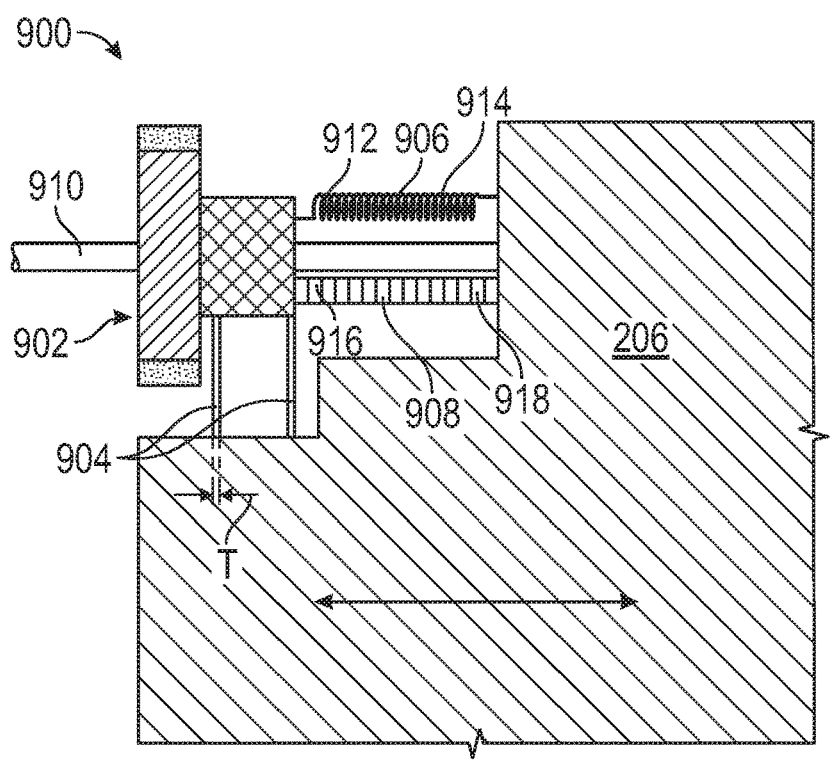
FIG. 13 illustrates a partial cross-sectional side elevation view of another representative embodiment of a position-setting assembly mounted on a guide.

FIG. 13 illustrates another exemplary embodiment of a position-setting assembly 900. Position-setting assembly 900 can comprise a restraint 902 similar to restraints 400 and 502, a position encoder (not shown) such as position encoder 508 described above, one or more flexure elements 904 (e.g., two in the illustrated embodiment), a biasing member 906, and an actuator 908, which can be configured similarly to the actuator 504. Position-setting assembly 900 can slidably engage a guide 910, such as linear guide 204 (see FIG. 6) which can comprise one or more linear bearings (e.g., liner bearings 238, 240). In the illustrated embodiment, the guide 910 comprises a linear bearing for purposes of illustration. The linear bearing can be one of the above-described linear bearings 238, 240 or the linear bearing can be a separate linear bearing extending parallel to linear bearings 238, 240. In other embodiments, the guide 910 can be a rotary guide having a curved configuration. The position-setting assembly 900 can be configured to position the carrier element 206 at a selected position along the guide 910.

The position-setting assembly 900 can be coupled to the carrier element 206 via the biasing member 906. The flexure elements 904 can be coupled to the restraint 902 and can engage the carrier element. The flexure elements 904 can be configured to elastically deform in a direction along the axis of the guide 910 to allow movement of the carrier element 206 along the guide 910, and to resist deformation along axes perpendicular to the axis of the guide 910. Each flexure element 904 can have a thickness T extending in the direction of movement (e.g., parallel to the guide 910), and a length extending perpendicular to the direction of movement (e.g., into the page in the orientation shown in FIG. 13). In some embodiments, the thickness T can be less than or equal to 0.5 mm, and the length L can be greater than 10 mm (for example, 15 mm, or 20 mm) thus constraining the carrier element to move axially along the linear guide 910. The flexure elements 904 can be, for example, spring steel blades.

The biasing member 906 can have a first end portion 912 coupled to the restraint 902 and a second end portion 914 coupled to the carrier element 206. In certain embodiments, the biasing member 906 can be configured to bias the carrier element 206 against the actuator 908. In the illustrated embodiment, the biasing member is a tension coil spring, however, in other embodiments, the biasing member can be any member configured to bias the carrier element against the actuator.

The actuator 908 can have a first end portion 916 and a second end portion 918. The first end portion 916 can be coupled to the restraint 902, and the second end portion 918 can be configured to abut a surface of the carrier element 206. In other embodiments, the first end portion 916 can abut the restraint 902 and the second end portion 918 can be coupled to the carrier element 206. When actuated (e.g., by applying a voltage), the actuator 908 can be configured to move between a neutral configuration, a contracted configuration, and/or an expanded configuration, as described above with respect to actuator 504.

Position-setting assembly 900 can be used to set the position of the carrier element 206 in the following exemplary manner. The motor (e.g., motor 210) can be energized to move the carrier element 206 to a first position. Once the carrier element 206 is at the first position (e.g., as determined by the position encoder) the motor can be deenergized and the restraint 902 can engage the guide 910. The actuator 908 can then be actuated (e.g., by applying a voltage) to move the carrier element 206 relative to the restraint 902 to a second position along the guide 910. The restraint 902 can then be disengaged from the guide 910 and the actuator 908 can be deactivated (e.g., by removing the applied voltage). The biasing member 906 can bias or move the restraint 902 (and therefore the actuator 908) toward the carrier element 206. The restraint 902 can then be re-engaged with the guide 910 to set the carrier element 206 at the second position. This sequence can be repeated as necessary until the carrier element 206 reaches the selected position.

The flexure elements 904 can flex when the actuator 908 is actuated, thus allowing the carrier element 206 to move relative to the restraint 902 without disengaging the restraint 902 from the carrier element 206. The flexure elements 904 can also reduce or prevent unwanted movement of the carrier element 206 in other axes (such into or out of the plane of the page).

As mentioned previously, the above-described position-setting assemblies and methods for their use can also be used with rotary guides to set or adjust an angular position of the carrier element 206 about one or more axes of the system. In such embodiments, the position-setting assemblies can function in essentially the same way as described above to make small movements to adjust the angle of the positioning system.

Figure 14:
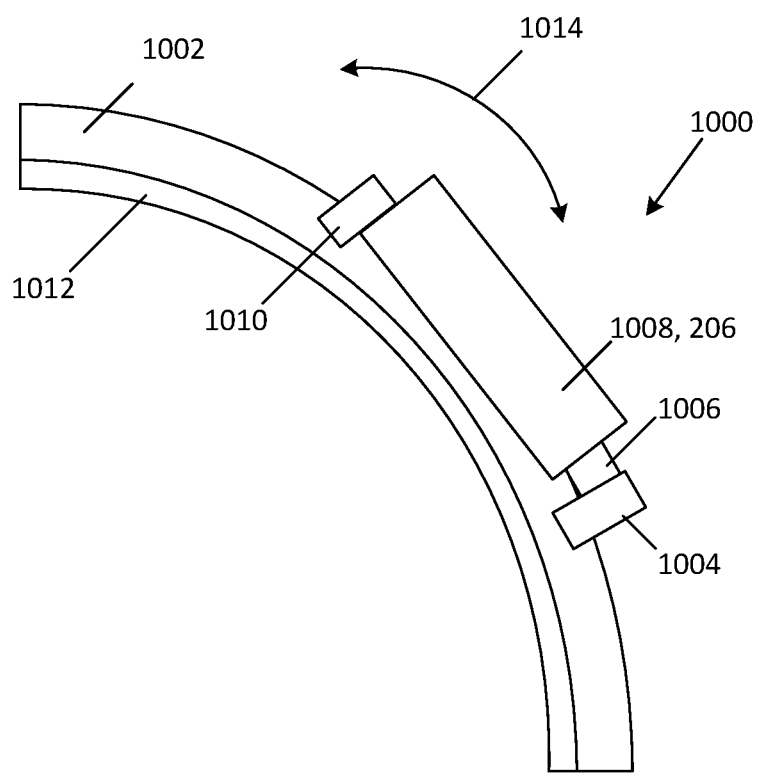
FIG. 14 is a schematic diagram of a representative embodiment of a position-setting assembly mounted on a rotary guide.

Referring now to FIG. 14, a position-setting assembly 1000 can be used to adjust the circumferential and/or angular position of the carrier element 206 (e.g., relative to the horizontal reference plane 214 (of FIG. 6) along a rotary guide 1002, as shown by arrow 1014. Position-setting assembly 1000 can comprise a restraint 1004, an actuator 1006, a drive mechanism 1008 (e.g., such as a mover element or shaft of a motor) coupled to the carrier element 206, and a position encoder 1010 configured to determine the position of the position-setting assembly 1000 along the rotary guide 1002 based on an encoder scale 1012. In certain embodiments, the restraint 1004 can be configured similarly to restraint 502, and the actuator 1006 can be configured similarly to actuator the 504.

In use, the position-setting assembly can function substantially as described above. For example, the drive mechanism 1008 can move the carrier element 206 along the rotary guide 1002 to a first position. Once in the first position, the restraint 1004 can be engaged and the drive mechanism 1008 can be deenergized. To move the carrier element to a second position, the actuator 1006 can be actuated (e.g., extended) to move the carrier element 206 relative to the restraint 1004 (e.g., upwards along the rotary guide in the orientation shown in FIG. 14). The restraint 1004 can then be disengaged, and the actuator 1006 actuated (e.g., contracted) to move the restraint 1004 relative to the carrier element 206 (e.g., to pull the restraint upwards toward the carrier element in the orientation shown in FIG. 14). The restraint 1004 can then be re-engaged with the guide 1002 to set the carrier element 206 at the second position. This sequence can be repeated as necessary until the carrier element 206 reaches the selected position. In other embodiments, the configuration illustrated in FIG. 13 may also be adapted for use with rotational guides.

In some embodiments, position-setting assemblies such as assembly 1000 can also be used to adjust the angular position of a workpiece, such as by rotating a wafer chuck 213 (see FIG. 6) (or a wafer engaged thereon) of the carrier element 206. In such embodiments, the position-setting assembly can be coupled to a rotational guide associated with the wafer chuck 213.

In some embodiments, the controller 700 can be configured as a digital signal processing (DSP) control system. In some particular embodiments, the DSP can be a dedicated real-time DSP control system.

Figure 15:
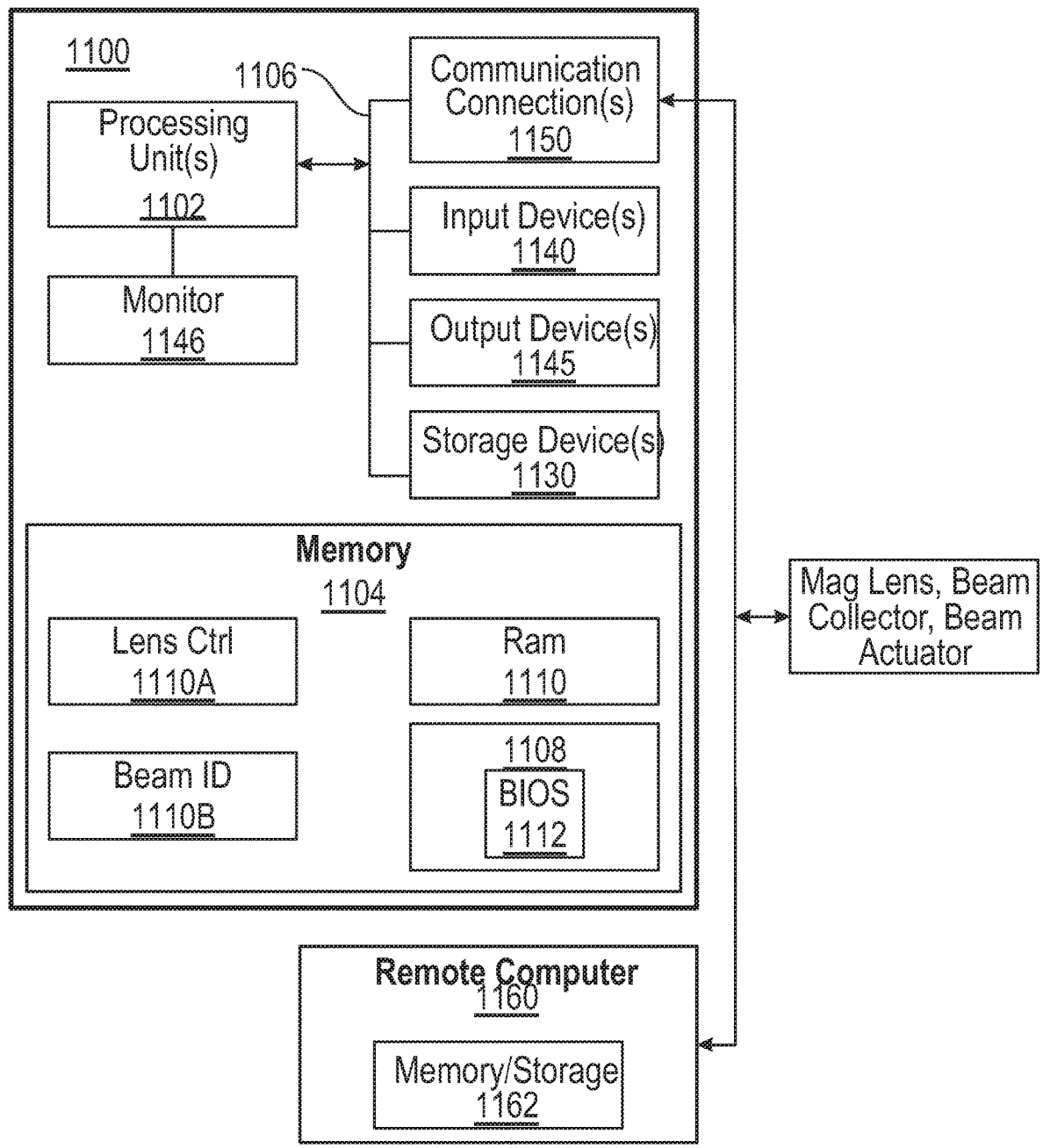
FIG. 15 illustrates a representative computer control system for use in implementing the disclosed methods and apparatus.

FIG. 15 and the following discussion are intended to provide a brief, general description of an exemplary computing environment in which the disclosed technology may be implemented. For example, controller 700 can be configured similarly to the computing environment described below. Moreover, the disclosed technology may be implemented with other computer system configurations, including hand held devices, digital signal processors (DSPs), multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

With reference to FIG. 15, an exemplary system for implementing the disclosed technology includes a general-purpose controller in the form of an exemplary conventional PC 1100, including one or more processing units 1102, a system memory 1104, and a system bus 1106 that couples various system components including the system memory 1104 to the one or more processing units 1102. The system bus 1106 may be any of several types of bus structures including a memory bus or memory controller, a peripheral bus, and a local bus using any of a variety of bus architectures. The exemplary system memory 1104 includes read only memory (ROM) 1108 and random-access memory (RAM) 1110. A basic input/output system (BIOS) 1112, containing the basic routines that help with the transfer of information between elements within the PC 1100, is stored in ROM 1108. In the example of FIG. 15, data and processor-executable instructions for controlling motion of the positioning system, imaging, processing, and other operational modes of an SEM and a FIB are stored in a memory 1110A, and data and processor-executable instructions for identifying and quantifying beam components are stored in memory 1110B.

The exemplary PC 1100 further includes one or more storage devices 1130 such as a hard disk drive for reading from and writing to a hard disk, a magnetic disk drive for reading from or writing to a removable magnetic disk, and an optical disk drive. Such storage devices can be connected to the system bus 1106 by a hard disk drive interface, a magnetic disk drive interface, and an optical drive interface, respectively. The drives and their associated computer readable media provide nonvolatile storage of computer-readable instructions, data structures, program modules, and other data for the PC 1100. Other types of computer-readable media which can store data that is accessible by a PC, such as magnetic cassettes, flash memory cards, digital video disks.

A number of program modules may be stored in the storage devices 1130 including an operating system, one or more application programs, other program modules, and program data. A user may enter commands and information into the PC 1100 through one or more input devices 1140 such as a keyboard and a pointing device such as a mouse. A monitor 1146 or other type of display device is also connected to the system bus 1106 via an interface, such as a video adapter.

The PC 1100 may operate in a networked environment using logical connections to one or more remote computers, such as a remote computer 1160. In some examples, one or more network or communication connections 1150 are included. The remote computer 1160 may be another PC, a server, a router, a network PC, or a peer device or other common network node, and typically includes many or all of the elements described above relative to the PC 1100, although only a memory storage device 1162 has been illustrated in FIG. 15. The personal computer 1100 and/or the remote computer 1160 can be connected to a logical a local area network (LAN) and a wide area network (WAN).

Having described and illustrated the principles of the disclosure with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples.

General Considerations

For purposes of this description, certain aspects, advantages, and novel features of the embodiments of this disclosure are described herein. The disclosed methods, apparatus, and systems should not be construed as being limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

All features described herein are independent of one another and, except where structurally impossible, can be used in combination with any other feature described herein.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Unless otherwise indicated, all numbers expressing material quantities, angles, pressures, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under test conditions/methods familiar to those of ordinary skill in the art. When directly and explicitly distinguishing embodiments from discussed prior art, the embodiment numbers are not approximates unless the word "about" is recited. Furthermore, not all alternatives recited herein are equivalents.

In view of the many possible embodiments to which the principles of the disclosure may be applied, it should be recognized that the illustrated embodiments are only preferred examples and should not be taken as limiting the scope of the disclosure. Rather, the scope of the disclosure is at least as broad as the following claims. We therefore claim all that comes within the scope and spirit of these claims.

I claim:

1. A positioning system, comprising:
a guide, the guide being movable relative to a horizontal reference plane such that a carrier element coupled to the guide is inclined with respect to the horizontal reference plane, the carrier element configured to engage and convey a workpiece;
a motor comprising a mover element, at least the mover element being coupled to the carrier element and configured to move the carrier element along the guide;
a restraint coupled to the carrier element, the restraint comprising a first actuator and a brake member configured to selectively engage the guide to restrain movement of the carrier element in at least one direction along the guide when the guide is inclined out of the horizontal reference plane; and
a second actuator disposed between the restraint and the carrier element, the second actuator being configured to displace the carrier element relative to the first actuator and the brake member of the restraint along the guide when the restraint is engaged with the guide.

2. The positioning system of claim 1, wherein:
the guide is a linear guide further comprising:
a linear bearing comprising a first end portion and a second end portion; and
wherein when the linear bearing is inclined out of the horizontal reference plane, the second end portion is spaced apart from the first end portion along a first axis parallel to the horizontal reference plane, and the second end portion is spaced apart from the first end portion along a second axis that is perpendicular to the horizontal reference plane such that the second end portion is higher than the first end portion.

3. The positioning system of claim 2, wherein:
the second actuator and the restraint are positioned between the first end portion of the linear bearing and the carrier element; and
the second actuator is configured to push the carrier element toward the second end portion of the linear bearing.

4. The positioning system of claim 2, wherein the second actuator is positioned between the carrier element and the second end portion of the linear bearing and configured to pull the carrier element toward the second end portion of the linear bearing.

5. The positioning system of claim 1, wherein the system further comprises a biasing member disposed between the restraint and the carrier element, the biasing member being configured to bias the carrier element against the second actuator at least whenever the restraint is engaged with the guide.

6. The positioning system of claim 5, wherein the biasing member is configured to move the restraint toward the carrier element when the restraint is disengaged from the guide.

7. The positioning system of claim 1, wherein the restraint is a first restraint coupled to a first end portion of the carrier element, and wherein the system further comprises a second restraint coupled to a second end portion of the carrier element and spaced apart from the first restraint along a longitudinal axis of the guide.

8. The positioning system of claim 1, wherein the second actuator comprises a piezoelectric actuator movable between a contracted configuration and an expanded configuration.

9. The positioning system of claim 1, wherein the guide is a rotary guide.

10. A multi-beam system, comprising:
a scanning electron microscope (SEM);
an ion column; and
the positioning system of claim 1, situated to selectively position a workpiece for imaging with the SEM or to receive an ion beam from the ion column.

11. A positioning system, comprising:
a guide, the guide being movable relative to a horizontal reference plane such that a carrier element coupled to the guide is inclined with respect to the horizontal reference plane, the carrier element configured to engage and convey a workpiece;
a motor comprising a mover element, at least the mover element being coupled to the carrier element and configured to move the carrier element along the guide;
a restraint coupled to the carrier element configured to selectively engage the guide to restrain movement of the carrier element in at least one direction along the guide when the guide is inclined out of the horizontal reference plane; and
an actuator disposed between the restraint and the carrier element, the actuator being configured to displace the carrier element relative to the restraint along the guide when the restraint is engaged with the guide;
further comprising one or more flexure elements coupled to the restraint and engaged with the carrier element, the flexure elements being configured to elastically deform in a direction along an axis of the guide to allow motion of the carrier element relative to the restraint and configured to resist deformation along axes perpendicular to the axis of the guide.

12. A method, comprising:
moving a carrier element along a guide with a motor, at least a mover element of the motor being coupled to the carrier element, the carrier element being inclined relative to a horizontal reference plane, the guide being movable relative to the horizontal reference plane, the carrier element being configured to engage and convey a workpiece;
engaging the guide with a restraint coupled to the carrier element to restrain movement of the carrier element in at least one direction along the guide, the restraint comprising a first actuator and a brake member; and
actuating a second actuator disposed between the restraint and the carrier element to move the carrier element relative to the first actuator and the brake member of the restraint along the guide while the restraint is engaged with the guide.

13. The method of claim 12, wherein:
the motor is a linear motor;
moving the carrier element along the guide further comprises energizing the linear motor and moving the mover element; and
the method further comprises, prior to actuating the second actuator, de-energizing the linear motor.

14. The method of claim 13, wherein the method further comprises:
with a position encoder coupled to the carrier element, determining a position of the carrier element along the guide; and
actuating the second actuator to move the carrier element from the determined position to a target position along the guide.

15. The method of claim 12, wherein the second actuator comprises a piezoelectric actuator.

16. The method of claim 15, wherein actuating the piezoelectric actuator comprises applying a positive voltage to the piezoelectric actuator to move the piezoelectric actuator from a neutral configuration to an expanded configuration.

17. The method of claim 15, wherein actuating the piezoelectric actuator comprises applying a negative voltage to the piezoelectric actuator to move the piezoelectric actuator from a neutral configuration to a contracted configuration.

18. The method of claim 12, wherein the method further comprises:
imaging a workpiece coupled to the carrier element with a scanning electron microscope (SEM);
actuating the second actuator to reposition the carrier element and the workpiece along the guide with respect to the SEM; and
imaging the workpiece with the SEM a second time.

19. A method, comprising:
moving a carrier element along a guide with a linear motor, at least a mover element of the linear motor being coupled to the carrier element, the carrier element being inclined relative to a horizontal reference plane, the guide being movable relative to the horizontal reference plane, the carrier element being configured to engage and convey a workpiece;
engaging the guide with a restraint coupled to the carrier element to restrain movement of the carrier element in at least one direction along the guide;
de-energizing the linear motor;
with a position encoder coupled to the carrier element, determining a position of the carrier element along the guide;
actuating an actuator disposed between the restraint and the carrier element to move the carrier element relative to the restraint along the guide from the determined position to a first target position,
disengaging the restraint from the guide;
actuating the actuator to move the restraint relative to the carrier element; and
re-engaging the guide with the restraint to restrain the carrier element at a second target position.

20. A system, comprising:
a guide, the guide being movable relative to a horizontal reference plane such that a carrier element coupled to the guide is inclined with respect to the horizontal reference plane, the carrier element being configured to engage and convey a workpiece;
a motor comprising a mover element, at least the mover element being coupled to the carrier element;
a restraint coupled to the carrier element and configured to selectively engage the guide, the restraint comprising a first actuator and a brake member;
a second actuator disposed between the restraint and the carrier element; and
a controller configured to:
transmit control signals to the motor to move the carrier element along the guide;
transmit control signals to the restraint to engage the guide to restrain movement of the carrier element in at least one direction along the guide; and
transmit control signals to the second actuator to actuate the second actuator to move the carrier element relative to the first actuator and the brake member of the restraint along the guide while the restraint is engaged with the guide.

* * * * *